(12) United States Patent
Wu

(10) Patent No.: US 6,555,438 B1
(45) Date of Patent: *Apr. 29, 2003

(54) METHOD FOR FABRICATING MOSFETS WITH A RECESSED SELF-ALIGNED SILICIDE CONTACT AND EXTENDED SOURCE/DRAIN JUNCTIONS

(76) Inventor: Shye-Lin Wu, No. 6, Creation Rd. 2, Science-Based Industrial Park, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/275,134

(22) Filed: Mar. 23, 1999

Related U.S. Application Data

(63) Continuation-in-part of application No. 09/025,969, filed on Feb. 19, 1998, now Pat. No. 6,063,680.

(51) Int. Cl.$^7$ .................. H01L 21/336; H01L 29/76; H01L 29/94; H01L 31/62; H01L 31/113
(52) U.S. Cl. .................. 438/305; 438/301; 438/303; 438/306; 438/307; 257/408; 257/396
(58) Field of Search .................. 438/305, 301, 438/303, 306, 307, 229, 230, 231, 232, 39; 257/408, 396, 398, 399, 400

(56) References Cited

U.S. PATENT DOCUMENTS

| | | | | |
|---|---|---|---|---|
| 4,963,502 A | * | 10/1990 | Teng et al. | 437/41 |
| 5,773,348 A | * | 6/1998 | Wu | 438/305 |
| 5,798,291 A | * | 8/1998 | Lee et al. | 438/301 |
| 5,856,226 A | * | 1/1999 | Wu | 438/291 |
| 5,877,056 A | * | 3/1999 | Wu | 438/291 |
| 5,895,244 A | * | 4/1999 | Wu | 438/303 |
| 5,902,125 A | * | 5/1999 | Wu | 438/300 |
| 5,956,584 A | * | 9/1999 | Wu | 438/232 |
| 5,972,762 A | * | 10/1999 | Wu | 438/305 |
| 5,994,176 A | * | 11/1999 | Wu | 438/200 |
| 5,994,747 A | * | 11/1999 | Wu | 257/408 |
| 6,020,240 A | * | 2/2000 | Wu | 438/275 |
| 6,034,396 A | * | 3/2000 | Wu | 257/332 |
| 6,046,090 A | * | 4/2000 | Wu | 438/303 |
| 6,063,706 A | * | 5/2000 | Wu | 438/682 |
| 6,087,234 A | * | 7/2000 | Wu | 438/299 |

OTHER PUBLICATIONS

Wolf, S.; Tauber, R. N.; Silicon Processing For the VLSI Era: vol. 1; Lattice Press; Sunset Beach, Ca.; 1986; pp. 311–314.*

* cited by examiner

Primary Examiner—Richard Booth
Assistant Examiner—Neal Berezny

(57) ABSTRACT

A method for fabricating MOSFETs with a recessed self-aligned silicide contact and extended source/drain junctions is described. A gate structure having a gate insulating layer, a first conductive layer and a first dielectric layer is formed on a substrate. A thermal oxide layer is formed on the substrate and on sidewalls of the first conductive layer. The first dielectric layer is removed. Extended source and drain junctions are formed in the substrate under a region covered by the first thermal oxide layer. Sidewall spacers are formed on the sidewalls of the gate structure to protect the extended source and drain junctions therebeneath from being silicided. The second thermal oxide layer is removed to form recessed regions on a substrate surface. A first metal layer is formed on the substrate after the first dielectric layer is removed. Source/drain regions under the recessed regions are formed.

19 Claims, 3 Drawing Sheets

METHOD FOR FABRICATING MOSFETS WITH A RECESSED SELF-ALIGNED SILICIDE CONTACT AND EXTENDED SOURCE/DRAIN JUNCTIONS

CROSS REFERENCE TO RELATED APPLICATIONS

This invention is a continuation-in-part application of an application filed with a Ser. No. of 09/025,969, under the title of "MOSFETSs with a recessed self-aligned silicide contact and an extended source/drain junction", and assigned to same assignee with the same inventor as the present application, which is now U.S. Pat. No. 6,063,860.

FIELD OF THE INVENTION

The present invention relates the fabrication process of semiconductor devices, and more specifically, to a method for fabricating metal oxide semiconductor field effect transistors (MOSFETs) with a recessed self-aligned silicide contact and extended source/drain junctions.

BACKGROUND OF THE INVENTION

From the birth of the first integrated circuit at 1960, the number of devices on a chip has grown in an explosive increasing rate. The progress of the semiconductor integrated circuits has step into ULSI (ultra large scale integration) level or even higher level after almost four decades of developments. The capacity of a single semiconductor chip increases from several thousand devices to hundreds of million devices, or even billions of devices. Integrated circuits devices like transistors, capacitors, and connections must be greatly miniaturized accompanying with the advancement. The increasing packing density of integrated circuits generates numerous challenges to the semiconductor manufacturing process. Every element or device needs to be formed within smaller area without influencing the characteristics and the operations of the integrated circuits. The demands on high packing density, low heat generation, and low power consumption devices with a good reliability and a long operation life must be maintained without any degradation in the function. These achievements are expected to be reached with the simultaneous developments and advancements in the photography, the etching, the deposition, the ion implantation, and the thermal processing technologies, namely the big five key aspects of semiconductor manufacturing. The continuous increase in the packing density of the integration circuits must be accompanied with a shrinking minimum feature size. With present semiconductor manufacturing technology, the processes with a generally one-third micrometer in size is widely utilized. For making the next generation devices, the technologies focusing mainly on one-tenth micrometer or even nanometer sizes are highly demanded.

Transistors, or more particularly metal oxide semiconductor field effect transistors (MOSFET), are the most important and frequently employed devices in the integrated circuits with the high performance. However with the continuous decrease in device size, the sub-micron scale MOS transistors have to face so many risky challenges. As the MOS transistors become narrower and thinner accompanying with shorter channels, problems like the junction punchthrough, the leakage, and the contact resistance, cause the reduction in the yield and reliability of the semiconductor manufacturing processes.

The self-aligned silicidation technology is a vital application to improve the operation speed of the ULSI/VLSI MOS devices in manufacturing the sub-micron feature size semiconductor devices. Unfortunately, there exists some trade-off in employing the technologies like self-aligned silicide. In general, the self-aligned silicidation process results a high junction leakage coming from the metal penetration. The metal penetration into the silicon substrate spikes the junction and/or the residual metal to cause the leakage problem. The silicide across the LDD spacer, which is not totally removed after the salicidation, causes the bridge between the adjacent devices like the gate and the source/drain regions. The detailed negative effects of the self-aligned silicidation technology on sub-micrometer devices are illustrated in the article of C. Y. Lu et al. ("Process Limitation and Device Design Tradeoffs of Self-Aligned TiSi2 Junction Formation in Submicrometer CMOS Devices", in EEE Trans. Electron Devices, vol. ED-38, No. 2, 1991) The device design tradeoffs for a shallow junction with a salicide structure is proposed. Process limitations of both junction formation schemes for sub-micrometer application and future scaling down are also established in the work.

In present fabrication process, the self-aligned silicide (SALICIDE) technology is widely use to increase the packing density of ULSI circuits and to reduce the interconnect resistance for high speed operation. One of the articles relates to the self-aligned silicide (SALICIDE) technology is the work of K. Fujii et al, titled "A Thermally Stable Ti—W Salicide for Deep-Submicron Logic with Embedded DRAM" (IEEE, IEDM 96–451, 1996). The above article found that Ti—5%W salicide has high-thermal stability up to 800° C. as well as sheet resistance for 0.18 $\mu$m devices.

As for "short channel effect", it could be improved by using the extended ultra-shallow source/drain junction. One of the solutions to the problems is proposed by A. Hori et al. in their work titled "A 0.05 $\mu$m-CMOS with Ultra Shallow Source/Drain Junctions Fabricated by 5 KeV Ion Implantation and Rapid Thermal Annealing" (IEEE, IEDM 94–485, 1994). A deep submicron PMOSFET has been fabricated together with a NMOSFET. In the proposed process, ultra shallow source/drain junctions were developed on the basis of 5 KeV ion implantation technology and rapid thermal annealing. The short channel effect was successfully suppressed and the delay time per stage of unloaded CMOS inverter is improved at the supply voltage of 1.5V.

SUMMARY OF THE INVENTION

The proposed method in the present invention forms metal oxide semiconductor field effect transistors (MOSFETs) with a recessed self-aligned suicide contact and extended source/drain junctions. The application of self-aligned metal silicide source drain contact, in combination with the metal suicide gate contact, raises the operation speed of the transistors. The structure of the extended ultra-shallow source/drain junctions improves the short channel effects in the conventional devices. The packing density of transistors in integrated circuit can be raised significantly with improved structure formed with the method of the present invention.

The method for fabricating metal oxide semiconductor field effect transistors (MOSFETs) includes steps as follows. At first, isolation regions are formed on a semiconductor substrate and a gate insulating layer is formed on the substrate. A first conductive layer is then formed on the gate insulating layer and a first dielectric layer is formed on the first conductive layer. A removing process is performed to remove portions of the gate insulating layer, the first conductive layer and the first dielectric layer to define a gate structure. A layer formation step is carried out to form a first thermal oxide layer on the substrate and on sidewalls of the first conductive layer. First sidewall spacers are then formed on sidewalls of the gate structure. A removing step is carried out to remove portions of the first thermal oxide layer uncovered by the first sidewall spacers. A second thermal oxide layer is then formed on exposed regions of the substrate.

Next, the first dielectric layer and the first sidewall spacers are removed. An ion implantation is carried out to form the extended source and drain junctions in the substrate under a region covered by the first thermal oxide layer. Second sidewall spacers are then formed on the sidewalls of the gate structure, and the second thermal oxide layer is removed to form recessed regions on the substrate surface. A first metal layer is formed on the substrate and a source/drain/gate implantation is performed to the substrate. A thermal process is performed to convert portions of the first metal layer into a metal silicide layer lying over the recessed regions and over the first conductive layer. The unreacted portions of the first metal layer are removed.

In addition to the aforementioned process of forming MOS transistors, several subsequent steps are typically performed to form interconnections. Firstly, a second dielectric layer is formed on the substrate and an annealing process is performed to the substrate. Portions of the second dielectric layer are removed to form contact holes. A second metal layer is then formed within the contact holes and on the second dielectric layer. Finally, portions of the second metal layer are removed to define interconnections with the remaining metal paths.

DETAILED DESCRIPTION OF THE PREFERRED EMBODIMENTS

The present invention discloses a method of fabricating metal oxide semiconductor field effect transistors (MOSFETs) with a recessed self-aligned silicide contact and extended source/drain junctions. Recessed source/drain regions are formed with an etching process with reduced etching damage and improved selectivity to other dielectrics such as oxide layers. A self-aligned silicide contact is formed without damaging bridging effect in the conventional processes, thus the operation speed of the devices can be significantly improved. With the extended source/drain junctions formed by the method of the present invention, the short channel effects, which are major problems encountered by the devices of reduced size in the ULSI stage, can be suppressed by the ultra shallow extended junctions in the present invention.

Figure 1:
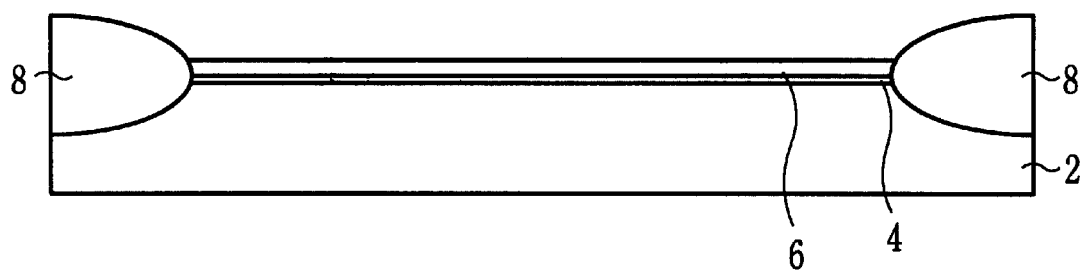
FIG. 1 is a cross-sectional view of forming a silicon oxide layer, a nitride layer and a field oxide region on a silicon substrate in accordance with the present invention.

The method and the steps in the present invention applied on a semiconductor wafer can create different types of transistors like the NMOS and the PMOS transistors, and also with a greater number of devices at a time. For a clear illustration, the steps for forming a single NMOS transistor are illustrated in detail. The PMOS transistors can also be fabricated by applying the similar method. Since the variations in the processes for incorporating the formation of the PMOS transistors are well known in the art, the details are not described. Referring to FIG. 1, a semiconductor substrate 2, preferably composed of single crystalline silicon in a <100> direction, is provided. A silicon oxide layer 4 is grown on the silicon substrate 2 by a thermal oxidation process. A silicon nitride layer 6 is deposited on the silicon oxide layer 4, typically by a chemical vapor deposition process like low pressure chemical vapor deposition (LPCVD). Next, portions of the silicon nitride layer 6 and of the silicon oxide layer 4 are removed via lithography and etching steps to define regions for forming isolation regions. Isolation regions such as field oxide (FOX) regions 8 are then grown on the substrate 2 through the employment of thermal oxidation process. The field oxide regions 8 provide isolation between devices on the substrate 2.

Figure 2:
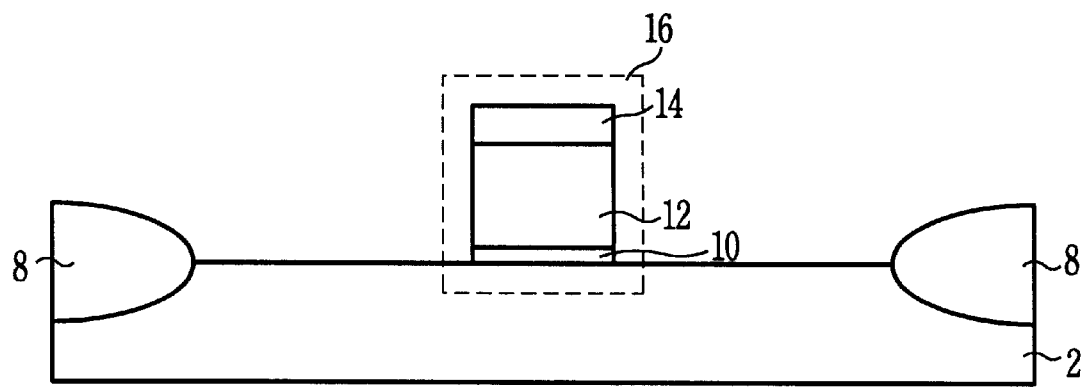
FIG. 2 is a cross-sectional view of defining a gate structure of transistors in accordance with the present invention.

Referring to FIG. 2, the silicon oxide layer 4 and the silicon nitride layer 6 are removed via wet etching step. Then, a gate insulating layer 10, preferably a silicon oxide layer in the case, is grown on the substrate 2, typically by a thermal oxidation process. Then, a first conductive layer 12 is formed on substrate 2, including the regions over the field oxide region 8 and the gate insulating layer 10. Next, a first dielectric layer 14 is formed on the first conductive layer 12. Following the formation of the three stacked layers 10, 12 and 14, portions of the gate insulating layer 10, the first conductive layer 12 and the first dielectric layer 14 are removed via lithography and etching steps, in order to define a gate structure 16 as shown in the figure.

In the preferred embodiments, the first conductive layer 12 is a doped polysilicon layer. The thickness of the first conductive layer 12 is about 1000 to 5000 angstroms. The first dielectric layer 14 is preferably a silicon nitride layer, which is also served as an anti-reflection layer in a later lithography process for defining gate regions. The silicon nitride layer can be formed with a chemical vapor deposition. Alternatively, a silicon oxide layer can also be employed as the first dielectric layer 14, which is typically formed with a major reacting gas of tetra-ethyl-ortho-silicate (TEOS) in a chemical vapor deposition process. The thickness of the first dielectric layer 14 is about 100 to 1000 angstroms.

Figure 3:
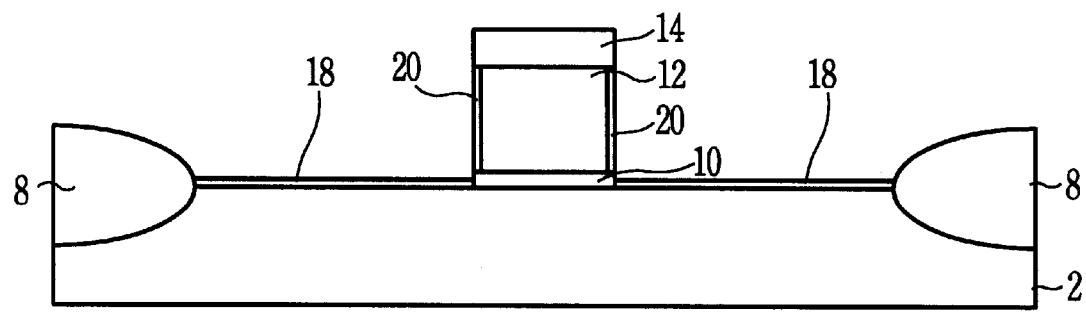
FIG. 3 is a cross-sectional view of forming a first thermal oxide layer on the silicon substrate and on the sidewalls of the first conductive layer in accordance with the present invention.

Referring to FIG. 3, a first thermal oxide layer, which includes two separate portions 18 and 20 as indicated in the figure, is grown on the substrate 2 and also on the sidewalls of the first conductive layer 12 by a thermal oxidation process. The first thermal oxide layer 18 on the substrate 2 is preferably grown in an $N_2O$ or NO ambient, in order to recover the etching damages of the substrate surface remained from the previous etching step. Preferably, the thickness of the first thermal oxide layer 18 is about 20 to 150 angstroms and the thickness of the first thermal oxide layer 20 is about 40 to 250 angstroms.

Figure 4:
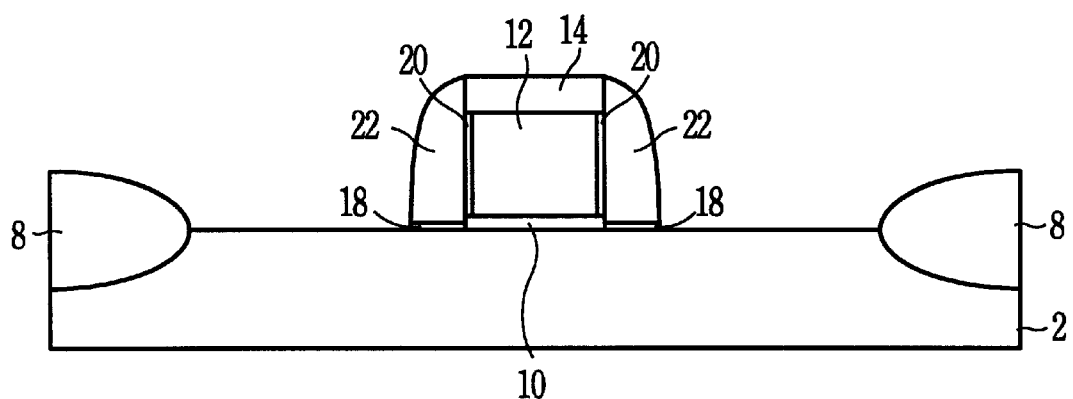
FIG. 4 is a cross-sectional view of forming first sidewall spacers on sidewalls of the gate structure in accordance with the present invention.

Turning to FIG. 4, first sidewall spacers 22 are then formed on the sidewalls of the gate structure 16. Generally, the first sidewall spacers 22 are formed by forming and etching back a nitride layer to have nitride spacers. In the preferred embodiments, a nitride layer is firstly deposited to cover over the field region 8, the first thermal oxide layer 18 and the gate structure 16. Next, portions of the nitride layer is removed to form the nitride spacers 22 by an etch back process, and portions of the first thermal oxide layer 18, which are located over the substrate 2 and uncovered by the nitride spacers 22, are preferably removed within the etching back process. The exposed portion of the first thermal oxide layer uncovered by the nitride spacers 22 are also removed in the etch back process, as shown in FIG. 4. In the preferred embodiments of the present invention, the thickness of the nitride layer is about 300 to 2500 angstroms, and the nitride layer is deposited by LPCVD or PECVD techniques with accompanied plasma processing systems.

Figure 5:
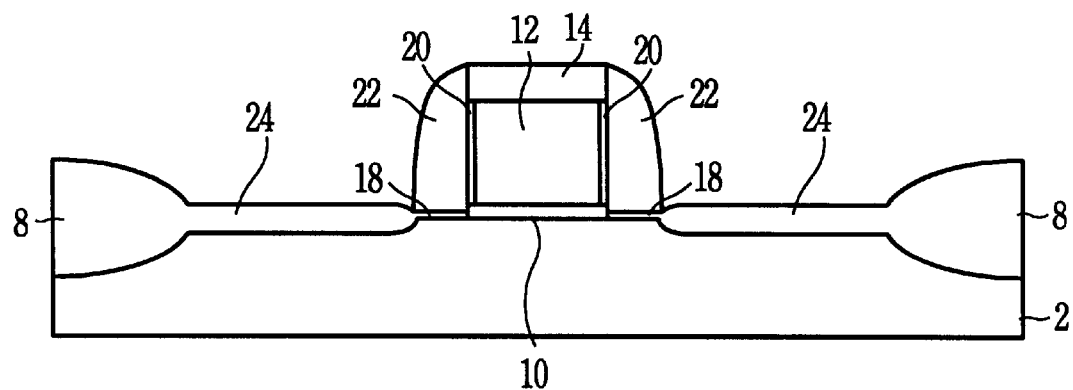
FIG. 5 is a cross-sectional view of forming a second thermal oxide layer on exposed regions of the substrate in accordance with the present invention.

Referring to FIG. 5, a second thermal oxide layer 24 is then grown on the exposed regions of the substrate. The second thermal oxide layer 24 is grown from the oxidization of the exposed silicon substrate 2 by thermal oxidation process, preferably with a temperature between about 750 to 1100° C. The thickness of the second thermal oxidelayer 24 is between about 300 to 2000 angstroms.

Figure 6:
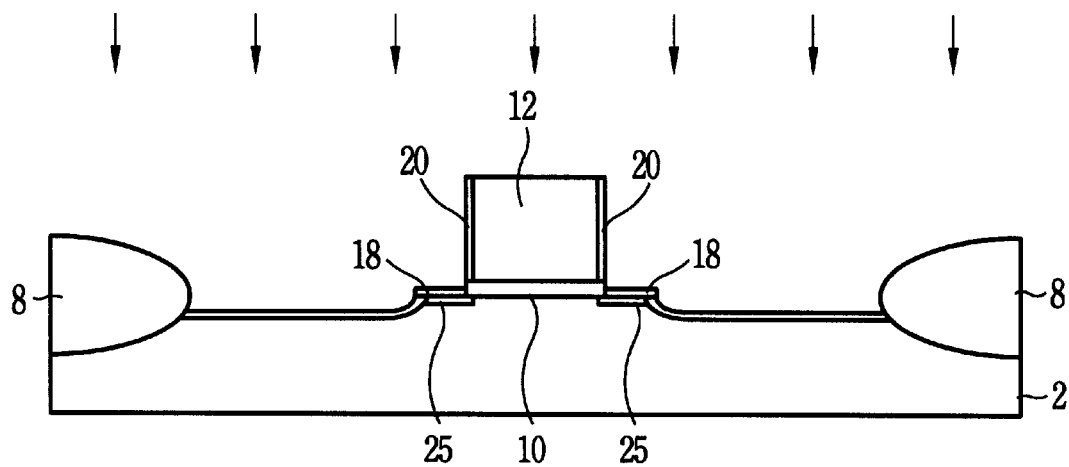
FIG. 6 is a cross-sectional view of removing the first dielectric layer and the first sidewall spacers, and performing an ion implantation to form the extended source and drain junctions in the substrate in accordance with the present invention.

Turning to FIG. 6, the first dielectric layer 14 located on the top of the gate structure 16 and the first sidewall spacers 22 are then removed. In the case of using nitride spacers and silicon nitride as the first dielectric layer 14, the first dielectric layer 14 and the first sidewall spacers 22 are typically removed by a hot $H_3PO_4$ solution in a wet etch process. The second thermal oxide layer 24 are also removed to form the recessed regions on the substrate 2.

An ion implantation is then performed to form extended source/drain junctions 25 in the substrate 2, under a region covered by the thin first thermal oxide 18. The regions under the recessed regions are also slightly doped. Preferably, the ion implantation, in the case of forming NMOS transistors, is performed with ions such as arsenic containing dopants and phosphorous containing dopants, at an energy between about 0.5 KeV to 30 KeV to have a dose between about 5E13 to 2E15 atoms/$cm^2$, in order to form the extended source/drain regions 25.

Figure 7:
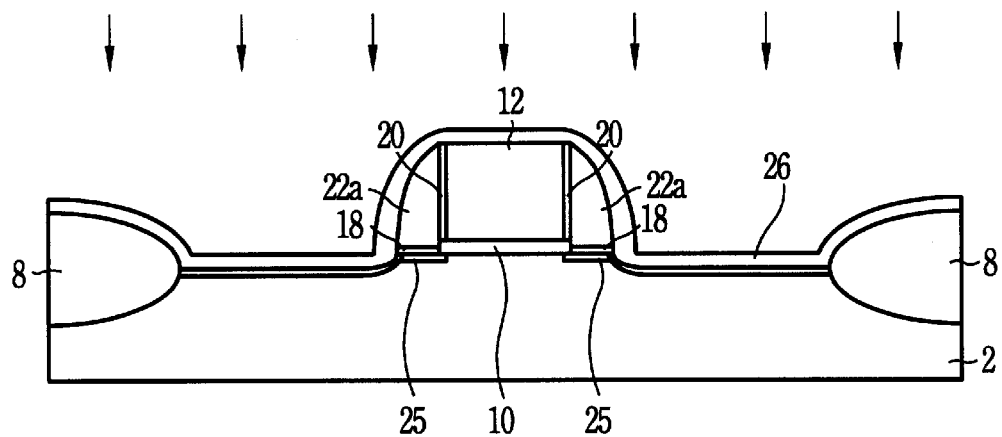
FIG. 7 is a cross-sectional view of forming second sidewall spacers, removing the second thermal oxide, depositing a first metal layer, and performing a source/drain/gate via ion implantation in accordance with the present invention.

Turning to FIG. 7, second sidewall spacers 22a are then formed on the sidewalls of the gate structure 16. The second sidewall spacers 22a can be formed either with silicon oxide or silicon nitride in the preferred embodiments, by the combination of a deposition and an etch back process.

A first metal layer 26 is deposited on the silicon substrate 2 and a source/drain/gate implantation is then performed via ion implantation technique. In the preferred embodiments of the present invention, the first metal layer 26 can be refractory metals or noble metals like Ti, W, Co, Pt, Ni or Cr and the like. The first metal layer 26 is deposited either by PVD sputtering or CVD systems. The thickness of the first metal layer 26 is about 50 to 1000 angstroms.

The source/drain/gate implantation, in the case of forming NMOS transistors, is performed with ions such as arsenic containing dopants and phosphorous containing dopants, at an energy between about 10 KeV to 120 KeV, in order to have a dose between about 5E14 to 5E16 atoms/$cm^2$. The implantated dopants will be driven in later to form source/drain junctions in the recessed regions of the substrate 2 and further dopes the polysilicon material in the gate structure 16.

Figure 8:
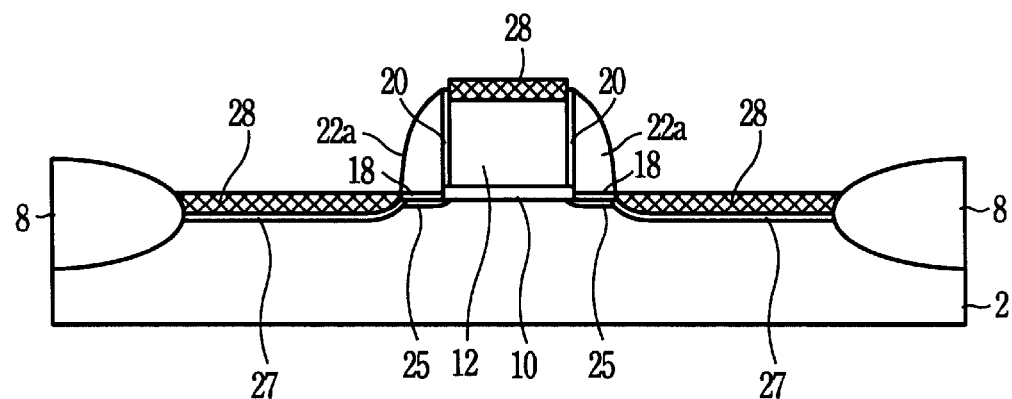
FIG. 8 is a cross-sectional view of forming a metal silicide layer on the source/drain junctions and on the gate structure in accordance with the present invention.

Referring to FIG. 8, a silicidation process is performed to convert portions of the first metal layer 26 and the contacting silicon materials, such as the silicon substrate 2 and the first conductive layer 12 of polysilicon, into a metal silicide layer 28. Therefore, portions of the first metal 26, which are located on the isolation region 8 and on the second sidewall spacers 22a, are remained unreacted after the silicidation process under a raised temperature between about 350 to 700° C. Under the thermal processing of the silicidation process, the dopants in the gate 12, the first metal layer 26, and the extended source/drain junctions 25 are further drove in and activated, by which source/drain junctions 27 are formed. The unreacted portions of the first metal 26 are removed. Preferably, the unreacted portions of the first metal 26 are removed by well known chemical wet etch.

Figure 9:
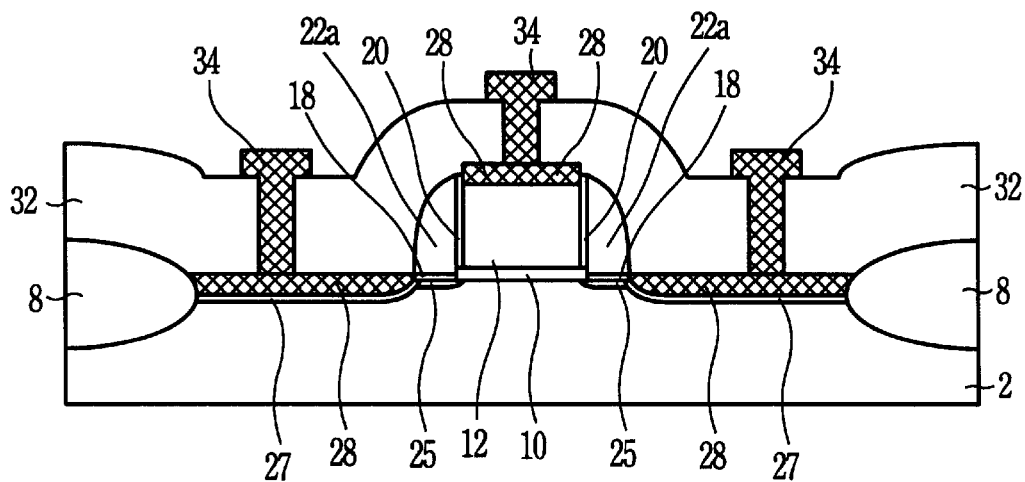
FIG. 9 is a cross-sectional view of depositing a second dielectric layer and defining interconnections in accordance with the present invention.

In addition to the aforementioned processes, several additional steps can be added to finish one or more layers of interconnections between devices. Turning to FIG. 9, a second dielectric layer 32 is then deposited, typically with chemical vapor deposition techniques. A silicon oxide based layer, like a silicon dioxide layer, can be used as the second dielectric layer 32. A thermal treatment, such as an annealing process in the case, can be performed to condense the second dielectric layer 32, and to anneal the metal silicide layer 28 into a stable phase. A well known rapid thermal process (RTP) can be employed in the preferred embodiments.

Next, portions of the second dielectric layer 32 are removed via lithography and etching processes to form contact holes within the second dielectric layer 32, extending down to the gate and the source/drain regions. A second metal layer 34 is deposited on the second dielectric layer 32 and filled into the contact holes. Finally, portions of the second metal layer 34 are removed to define interconnections between various devices on the substrate 2. In the preferred embodiments, the second metal layer 34 can be conductive materials like Al, W, Cu, Ti, Pt, Cr, Ni, and their compounds or combinations.

The proposed method in the present invention forms metal oxide semiconductor field effect transistors (MOSFETs) with recessed self-aligned silicide contacts and extended source/drain junctions. The application of self-aligned silicide source drain contacts, in combination with the silicide gate contacts, raises the operation speed of the transistors. The structure of the extended ultra-shallow source/drain junctions improves the short channel effects in the conventional devices. The packing density of transistors in integrated circuit can be raised significantly with improved structure formed with the method of the present invention.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

I claim:
1. A method of fabricating metal oxide semiconductor field effect transistors (MOSFETs) with a recessed self-aligned silicide contact and extended source/drain junctions, said method comprising the steps of:
  forming isolation regions on a semiconductor substrate;
  forming a gate insulating layer on said substrate;
  forming a first conductive layer on said gate insulating layer;
  forming a first dielectric layer on said first conductive layer;
  removing portions of said gate insulating layer, said first conductive layer and said first dielectric layer to define a gate structure;
  forming a first thermal oxide layer on said substrate and on sidewalls of said first conductive layer;
  forming first sidewall spacers on sidewalls of said gate structure;
  removing portions of said first thermal oxide layer uncovered by said first sidewall spacers;
  forming a second thermal oxide layer on exposed regions of said substrate;
  removing said first dielectric layer and said first sidewall spacers;
  performing an ion implantation to form said extended source and drain junctions in said substrate under a region covered by said first thermal oxide layer;
  forming second sidewall spacers on said sidewalls of said gate structure;
  removing said second thermal oxide layer to form recessed regions on a substrate surface;
  forming a first metal layer on said substrate;
  performing a source/drain/gate implantation to said substrate, thereby forming source/drain regions under said recessed regions;
  performing a thermal process to convert portions of said first metal layer into a metal silicide layer lying on said recessed regions and on said first conductive layer, thereby forming source/drain junctions beneath said recessed regions; and
  removing unreacted portions of said first metal layer.

2. The method of claim 1 further comprises the steps of:
  forming a second dielectric layer on said substrate after said unreacted portions of said first metal layer are removed;
  performing an annealing process to said substrate;
  removing portions of said second dielectric layer to form contact holes;
  forming a second metal layer within said contact holes and on said second dielectric layer; and
  removing portions of said second metal layer to define interconnections.

3. The method of claim 2, wherein said second dielectric layer comprises silicon oxide.

4. The method of claim 1, wherein said gate insulating layer comprises silicon oxide.

5. The method of claim 1, wherein said first conductive layer comprises doped polysilicon.

6. The method of claim 1, wherein said first dielectric layer comprises silicon nitride.

7. The method of claim 1, wherein said first sidewall spacers and said second sidewall spacers are nitride spacers.

8. The method of claim 1, wherein said second sidewall spacers is selected from the group consisting of nitride spacers and oxide spacers.

9. The method of claim 1, wherein said first metal layer is selected from the group consisting of Ti, W, Co, Pt, Ni and Cr.

10. The method of claim 1, wherein said source/drain/gate implantation is performed with ions selected from the group consisting of arsenic containing dopants and phosphorous containing dopants, at an energy between about 10 KeV to 120 KeV to have a dose between about 5E14 to 5E16 atoms/cm$^2$.

11. The method of claim 1, wherein said ion implantation to form extended source and drain junctions is performed with ions selected from the group consisting of arsenic containing dopants and phosphorous containing dopants, at an energy between about 0.5 KeV to 30 KeV to have a dose between about 5E13 to 2E15 atoms/cm$^2$.

12. A method of fabricating metal oxide semiconductor field effect transistors (MOSFETs) with a recessed self-aligned silicide contact and extended source/drain junctions, said method comprising the steps of:
  forming isolation regions on a semiconductor substrate, said semiconductor substrate having a first dopant types
  forming a gate insulating layer on said substrate;
  forming a first conductive layer on said gate insulating layer;
  forming a first dielectric layer on said first conductive layer;
  removing portions of said gate insulating layer, said first conductive layer and said first dielectric layer to define a gate structure;
  forming a first thermal oxide layer on said substrate and on sidewalls of said first conductive layer;
  forming first sidewall spacers on sidewalls of said gate structure;
  removing portions of said first thermal oxide layer uncovered by said first sidewall spacers;
  forming a second thermal oxide layer on exposed regions of said substrate;
  removing said first dielectric layer and said first sidewall spacers;
  performing an ion implantation to form said extended source and drain junctions in said substrate under a region covered by said first thermal oxide layer;
  forming second sidewall spacers on said sidewalls of said gate structure;
  removing said second thermal oxide layer to form recessed regions on a substrate surface;
  forming a first metal layer on said substrate;
  performing a source/drain/gate implantation to said substrate with a second dopant type different from said first dopant type, thereby forming source/drain regions under said recessed regions;
  performing a thermal process to convert portions of said first metal layer into a metal silicide layer lying on said recessed regions and on said first conductive layer, thereby forming source/drain junctions beneath said recessed regions;
  removing unreacted portions of said first metal layer;
  forming a second dielectric layer on said substrate;
  performing an annealing process to said substrate;
  removing portions of said second dielectric layer to form contact holes;
  forming a second metal layer within said contact holes and on said second dielectric layer; and removing portions of said second metal layer to define interconnections.

13. The method of claim 12, wherein said first conductive layer comprises doped polysilicon.

14. The method of claim 12, wherein said first dielectric layer comprises silicon nitride.

15. The method of claim 12, wherein said first sidewall spacers comprises nitride spacers.

16. The method of claim 12, wherein said second sidewall spacers is selected from the group consisting of nitride spacers and oxide spacers.

17. The method of claim 12, wherein said first metal layer is selected from the group consisting of Ti, W, Co, Pt, Ni and Cr.

18. The method of claim 12, wherein said source/drain/gate implantation is performed with ions selected from the group consisting of arsenic containing dopants and phosphorous containing dopants, at an energy between about 10 KeV to 120 KeV to have a dose between about 5E14 to 5E16 atoms/cm$^2$.

19. The method of claim 12, wherein said ion implantation to form extended source and drain junctions is performed with ions selected from the group consisting of arsenic containing dopants and phosphorous containing dopants, at an energy between about 0.5 KeV to 30 KeV to have a dose between about 5E13 to 2E15 atoms/cm$^2$.

* * * * *